(12) United States Patent
Song et al.

(10) Patent No.: US 11,502,459 B2
(45) Date of Patent: Nov. 15, 2022

(54) BACKPLANE CONNECTOR WITH IMPROVED SHIELDING EFFECT

(71) Applicant: Dongguan Luxshare Technologies Co., Ltd, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 48 days.

(21) Appl. No.: 17/334,187

(22) Filed: May 28, 2021

(65) Prior Publication Data
US 2021/0399475 A1    Dec. 23, 2021

(30) Foreign Application Priority Data

Jun. 19, 2020  (CN) .......................... 202010567796.4
Jul. 22, 2020  (CN) .......................... 202021461747.4

(51) Int. Cl.
*H01R 4/66*       (2006.01)
*H01R 13/6471*    (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/71; H01R 13/6471;
(Continued)

(56) References Cited

U.S. PATENT DOCUMENTS

| 4,601,527 A | 7/1986 | Lemke |
| 5,664,968 A | 9/1997 | Mickievicz |

(Continued)

FOREIGN PATENT DOCUMENTS

| CN | 1244959 A | 2/2000 |
| CN | 2513252 Y | 9/2002 |

(Continued)

*Primary Examiner* — Khiem M Nguyen
(74) *Attorney, Agent, or Firm* — Birch, Stewart, Kolasch & Birch, LLP

(57) ABSTRACT

A backplane connector includes a number of conductive terminals, an insulating frame, a first metal shield and a second metal shield. Each conductive terminal includes a connection portion. The conductive terminals include differential signal terminals, a first ground terminal and a second ground terminal. The first metal shield and the second metal shield are respectively in contact with two opposite side surfaces of the first ground terminal and the second ground terminal. As a result, a shielding cavity surrounding the connection portions of the differential signal terminals is formed. This arrangement can provide better shielding for the differential signal terminals over the length of the connection portion, reduce crosstalk, and improve the quality of signal transmission.

12 Claims, 23 Drawing Sheets

(51) Int. Cl.

| | | |
|---|---|---|
| *H01R 13/40* | (2006.01) | |
| *H01R 13/6587* | (2011.01) | |
| *H01R 13/6591* | (2011.01) | |
| *H01R 13/514* | (2006.01) | |
| *H01R 13/518* | (2006.01) | |
| *H01R 12/72* | (2011.01) | |
| *H01R 13/6586* | (2011.01) | |
| *H01R 12/58* | (2011.01) | |
| *H05K 1/11* | (2006.01) | |
| *H01R 13/6588* | (2011.01) | |
| *H01R 13/6583* | (2011.01) | |
| *H01R 13/6585* | (2011.01) | |
| *H01R 13/6582* | (2011.01) | |
| *H01R 43/24* | (2006.01) | |
| *H01R 12/71* | (2011.01) | |
| *H01R 13/20* | (2006.01) | |
| *H01R 13/504* | (2006.01) | |
| *H01R 13/6461* | (2011.01) | |
| *H01R 13/6584* | (2011.01) | |
| *H01R 13/6474* | (2011.01) | |

(52) U.S. Cl.
CPC .......... *H01R 12/724* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H01R 12/71* (2013.01); *H01R 13/6474* (2013.01)

(58) Field of Classification Search
CPC ............ H01R 13/6474; H01R 13/6591; H01R 13/6588; H01R 13/6587; H01R 13/6586; H01R 13/6585; H01R 13/6584; H01R 13/6583; H01R 13/6582; H01R 13/6461; H01R 13/518; H01R 13/514; H01R 13/504; H01R 13/40; H01R 13/20; H01R 43/24; H05K 1/115
USPC .................................. 439/108, 701
See application file for complete search history.

(56) References Cited

U.S. PATENT DOCUMENTS

| | | |
|---|---|---|
| 9,350,126 B2 | 5/2016 | Little et al. |
| 2004/0043658 A1 | 3/2004 | Ko |
| 2004/0229510 A1 | 11/2004 | Lloyd et al. |
| 2007/0155239 A1 | 7/2007 | Nakada |
| 2008/0014798 A1 | 1/2008 | Pan |
| 2013/0203273 A1 | 8/2013 | Rathburn |
| 2014/0051295 A1 | 2/2014 | Westman et al. |
| 2014/0248796 A1 | 9/2014 | Pan |
| 2014/0295705 A1 | 10/2014 | Lee et al. |
| 2015/0194771 A1 | 7/2015 | Pan |
| 2015/0303618 A1 | 10/2015 | Lee et al. |
| 2015/0318642 A1 | 11/2015 | Lee et al. |
| 2016/0093985 A1 | 3/2016 | Zhang et al. |
| 2016/0322760 A1 | 11/2016 | Long et al. |
| 2018/0166828 A1 | 6/2018 | Gailus |

FOREIGN PATENT DOCUMENTS

| | | |
|---|---|---|
| CN | 2571026 Y | 9/2003 |
| CN | 1491465 A | 4/2004 |
| CN | 1592990 A | 3/2005 |
| CN | 2682605 Y | 3/2005 |
| CN | 101159354 A | 4/2008 |
| CN | 201142392 Y | 10/2008 |
| CN | 101330172 A | 12/2008 |
| CN | 101527409 A | 9/2009 |
| CN | 101542640 A | 9/2009 |
| CN | 101728667 A | 6/2010 |
| CN | 101459299 B | 11/2010 |
| CN | 102088148 A | 6/2011 |
| CN | 102290653 A | 12/2011 |
| CN | 102468562 A | 5/2012 |
| CN | 202395246 U | 8/2012 |
| CN | 102694308 A | 9/2012 |
| CN | 102969621 A | 3/2013 |
| CN | 103151650 A | 6/2013 |
| CN | 103247918 A | 8/2013 |
| CN | 103296546 A | 9/2013 |
| CN | 103311746 A | 9/2013 |
| CN | 203589266 U | 5/2014 |
| CN | 103928795 A | 7/2014 |
| CN | 103988371 A | 8/2014 |
| CN | 104037551 A | 9/2014 |
| CN | 104241975 A | 12/2014 |
| CN | 104396095 A | 3/2015 |
| CN | 104505678 A | 4/2015 |
| CN | 104577406 A | 4/2015 |
| CN | 204304028 U | 4/2015 |
| CN | 104779487 A | 7/2015 |
| CN | 104810657 A | 7/2015 |
| CN | 105024230 A | 11/2015 |
| CN | 105470679 A | 4/2016 |
| CN | 105470732 A | 4/2016 |
| CN | 105470736 A | 4/2016 |
| CN | 105612664 A | 5/2016 |
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | 201733225 A | 9/2017 |
| TW | I600231 B | 9/2017 |
| TW | I623154 B | 5/2018 |
| TW | 201841440 A | 11/2018 |

(56) References Cited

FOREIGN PATENT DOCUMENTS

| TW | I648925 B | 1/2019 |
|----|-----------|--------|
| TW | M585436 U | 10/2019 |
| TW | 201943158 A | 11/2019 |
| TW | M591270 U | 2/2020 |
| TW | M593091 U | 4/2020 |
| WO | WO 2016/168820 A1 | 10/2016 |
| WO | WO 2017/106266 A1 | 6/2017 |

BACKPLANE CONNECTOR WITH IMPROVED SHIELDING EFFECT

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202021461747.4, filed on Jul. 22, 2020 and titled "BACKPLANE CONNECTOR", the entire content of which is incorporated herein by reference.

TECHNICAL FIELD

The present disclosure relates to a backplane connector which belongs to a technical field of connectors.

BACKGROUND

Existing backplane connectors usually include an insulating housing and a plurality of wafers assembled to the insulating housing. Each wafer includes an insulating frame, a plurality of conductive terminals insert-molded with the insulating frame, and a metal shield mounted to at least one side of the insulating frame. The conductive terminals usually include multiple pairs of differential signal terminals, a first ground terminal located on one side of each pair of differential signal terminals, and a second ground terminal located on the other side of each pair of differential signal terminals. The first ground terminal, the second ground terminal and the metal shield provide shielding for the differential signal terminals in order to reduce signal crosstalk and improve the quality of signal transmission.

However, with the continuous improvement of the signal transmission requirements of high-speed connectors, there is still room for improvement in the shielding of the differential signal terminals of the existing backplane connectors.

SUMMARY

An object of the present disclosure is to provide a backplane connector with improved shielding effect.

In order to achieve the above object, the present disclosure adopts the following technical solution: a backplane connector, comprising a wafer, the wafer comprising: a plurality of conductive terminals, each conductive terminals comprising a connection portion; an insulating frame fixed with the connection portions; a first metal shield comprising a first main body portion located on one side of the connection portions of the conductive terminals; and a second metal shield comprising a second main body portion located on the other side of the connection portions of the conductive terminals; wherein the conductive terminals comprise differential signal terminals, a first ground terminal and a second ground terminal, and the differential signal terminals are located between the first ground terminal and the second ground terminal; wherein the first main body portion comprises a first rib protruding toward the first ground terminal and a second rib protruding toward the second ground terminal; wherein the second main body portion comprises a third rib protruding toward the first ground terminal and a fourth rib protruding toward the second ground terminal; wherein the first rib and the third rib are respectively in contact with two opposite side surfaces of the connection portion of the first ground terminal, and the second rib and the fourth rib are respectively in contact with two opposite side surfaces of the connection portion of the second ground terminal; and wherein the first main body portion, the second main body portion, the first ground terminal and the second ground terminal jointly form a shielding cavity which encloses the connection portions of the differential signal terminals.

Compared with the prior art, the first main body portion, the second main body portion, the first ground terminal and the second ground terminal of the present disclosure form a shielding cavity for enclosing the connection portions of the differential signal terminals. The shielding cavity is capable of providing better shielding effect for the differential signal terminals along the length of the connection portions of the differential signal terminals, reducing crosstalk, and improving the quality of signal transmission.

DETAILED DESCRIPTION

Figure 1:
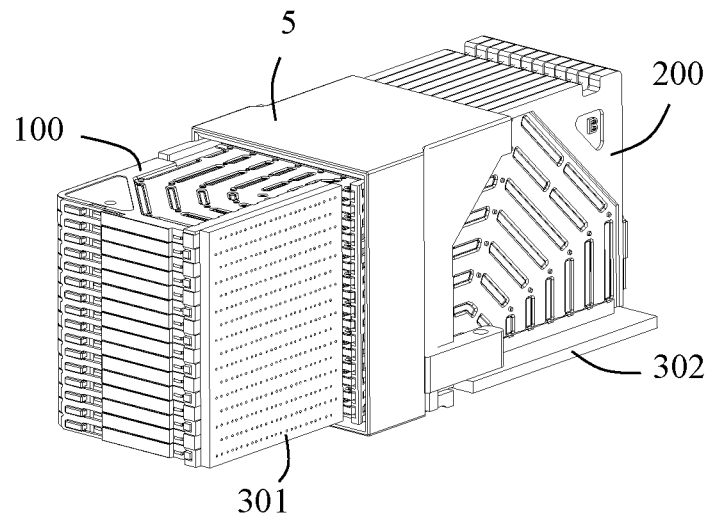
FIG. 1 is a perspective view of a backplane connector assembly in accordance with an embodiment of the disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
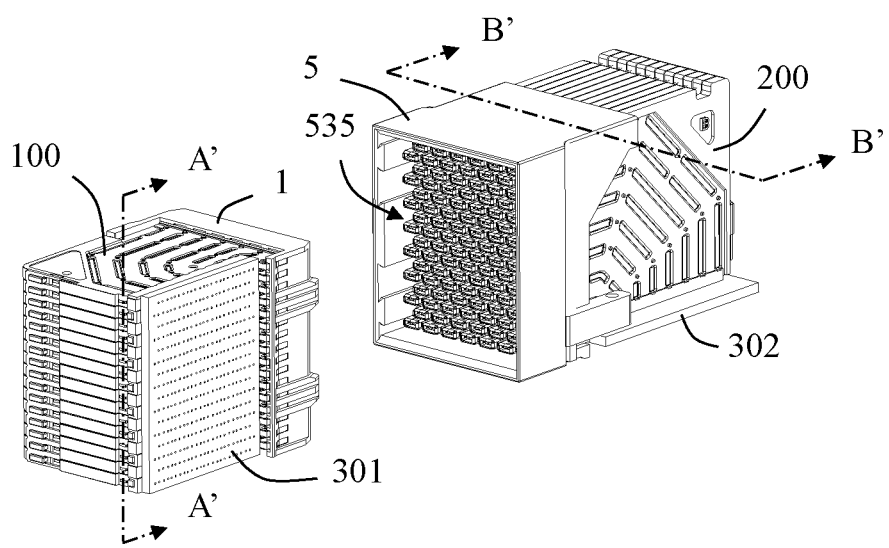
FIG. 2 is a partial perspective exploded view of FIG. 1.

Referring to FIGS. 1 and 2, an embodiment of the present disclosure discloses a backplane connector assembly which includes a first backplane connector 100, a second backplane connector 200 for mating with the first backplane connector 100, a first circuit board 301 mounted with the first backplane connector 100, and a second circuit board 302 mounted with the second backplane connector 200. In the illustrated embodiment of the present disclosure, the first backplane connector 100 and the second backplane connector 200 are mated in an orthogonal manner. The first circuit board 301 is perpendicular to the second circuit board 302.

Figure 3:
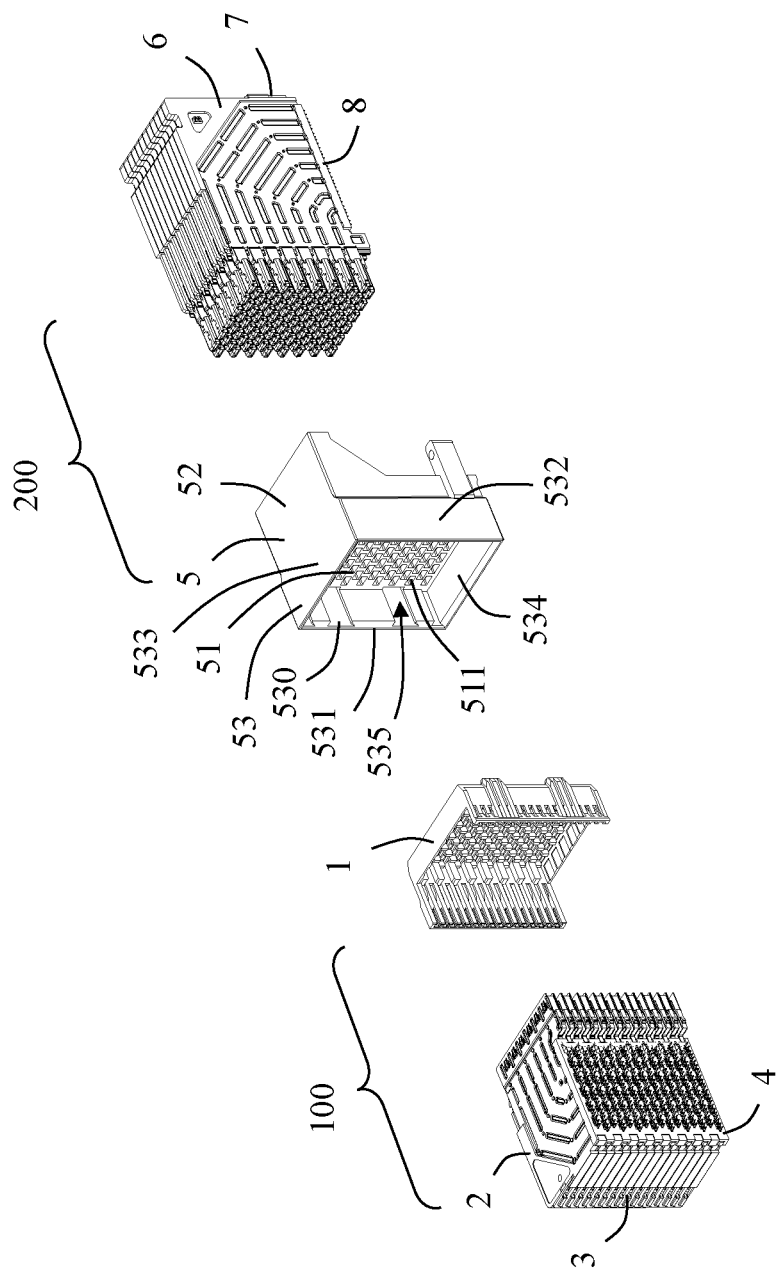
FIG. 3 is a further perspective exploded view of FIG. 2.
Figure 4:
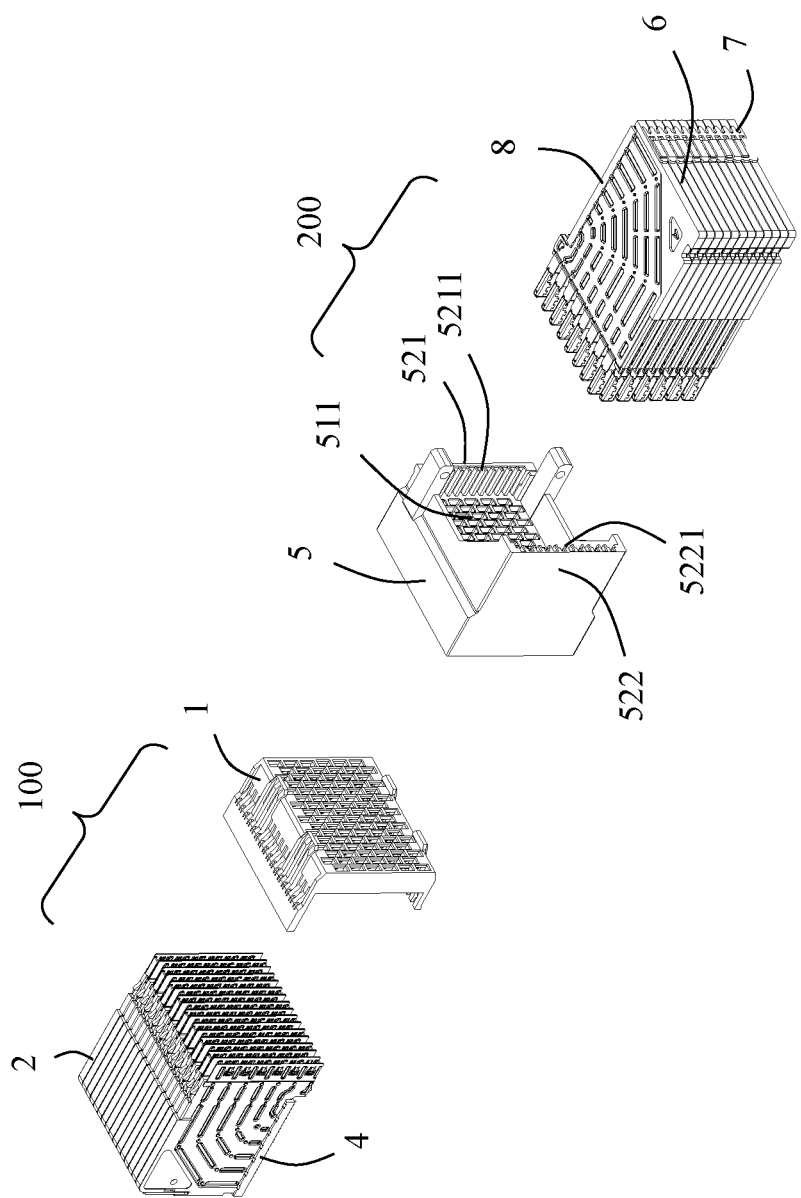
FIG. 4 is a perspective exploded view of FIG. 3 from another angle.

Referring to FIGS. 3 and 4, the first backplane connector 100 includes a header 1, a plurality of wafers 2 assembled to the header 1, a spacer 3 fixed at a rear end of the plurality of wafers 2, and a mounting block 4 mounted at a bottom end of the plurality of wafers 2.

Figure 5:
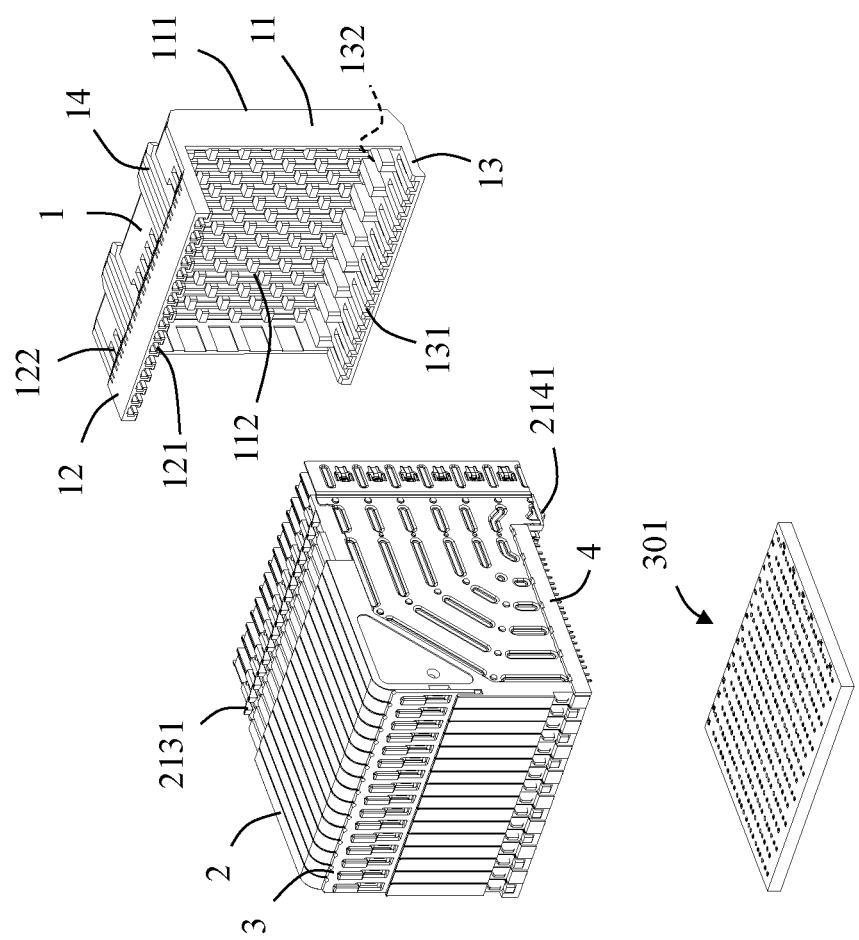
FIG. 5 is a partially exploded perspective view of a first backplane connector and a first circuit board.
Figure 6:
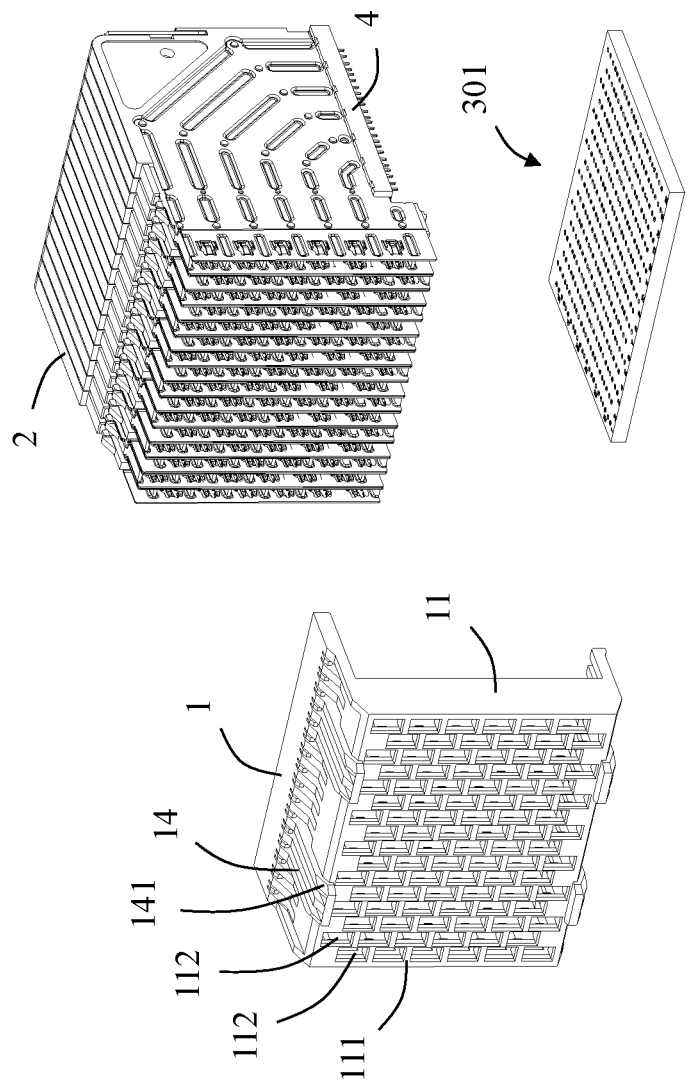
FIG. 6 is a partial perspective exploded view of FIG. 5 from another angle.

Referring to FIGS. 5 and 6, in an embodiment of the present disclosure, the header 1 is made of insulating material. The header 1 includes a body portion 11, a first wall portion 12 extending rearwardly from one side of the body portion 11, and a second wall portion 13 extending rearwardly from the other side of the body portion 11. The first wall portion 12 and the second wall portion 13 are in parallel. The body portion 11 includes a mating surface 111 and a plurality of terminal receiving grooves 112 extending through the mating surface 111. In the illustrated embodiment of the present disclosure, the terminal receiving grooves 112 are disposed in multiple rows along a left-right direction, wherein two adjacent rows of terminal receiving grooves 112 are staggered in a vertical direction. That is, in two adjacent rows of terminal receiving grooves 112, the terminal receiving grooves 112 at corresponding positions are not in alignment in the left-right direction. The first wall portion 12 includes a plurality of first slots 121 and a plurality of first locking grooves 122 communicating with corresponding first slots 121. The second wall portion 13 includes a plurality of second slots 131 and a plurality of second locking grooves 132 communicating with corresponding second slots 131. The first locking grooves 122 and the second locking grooves 132 extend outwardly along the vertical direction through the first wall portion 12 and the second wall portion 13, respectively. The first locking grooves 122 and the second locking grooves 132 are adapted to lock with the wafers 2 in order to prevent the wafers 2 from being separated from the header 1. The first slot 121, the second slot 131 and the terminal receiving grooves 112 which are in alignment with each other along the vertical direction are used to receive the same wafer 2.

Besides, referring to FIG. 6, the header 1 also includes a plurality of positioning protrusions 14 extending forwardly from the first wall portion 12 and the second wall portion 13, respectively. The positioning protrusions 14 protrude beyond the mating surface 111. Each positioning protrusion 14 includes a guiding inclined surface 141 formed at an end thereof.

Figure 7:
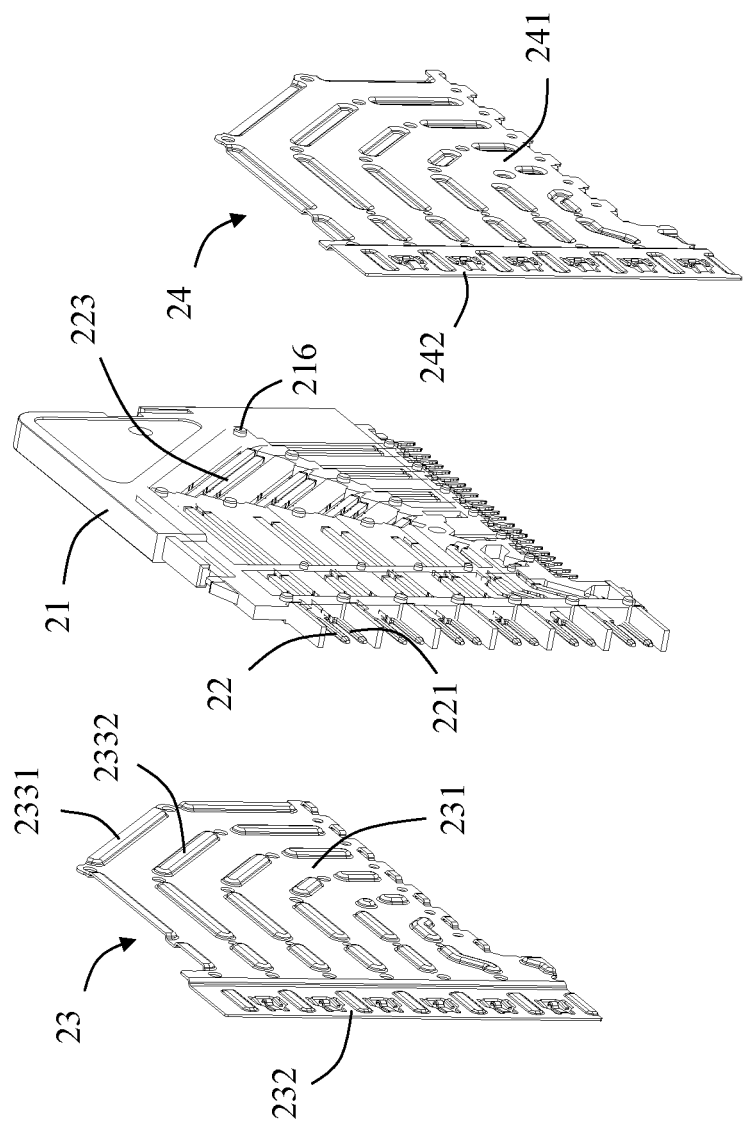
FIG. 7 is a partial perspective exploded view of a wafer of the first backplane connector.
Figure 8:
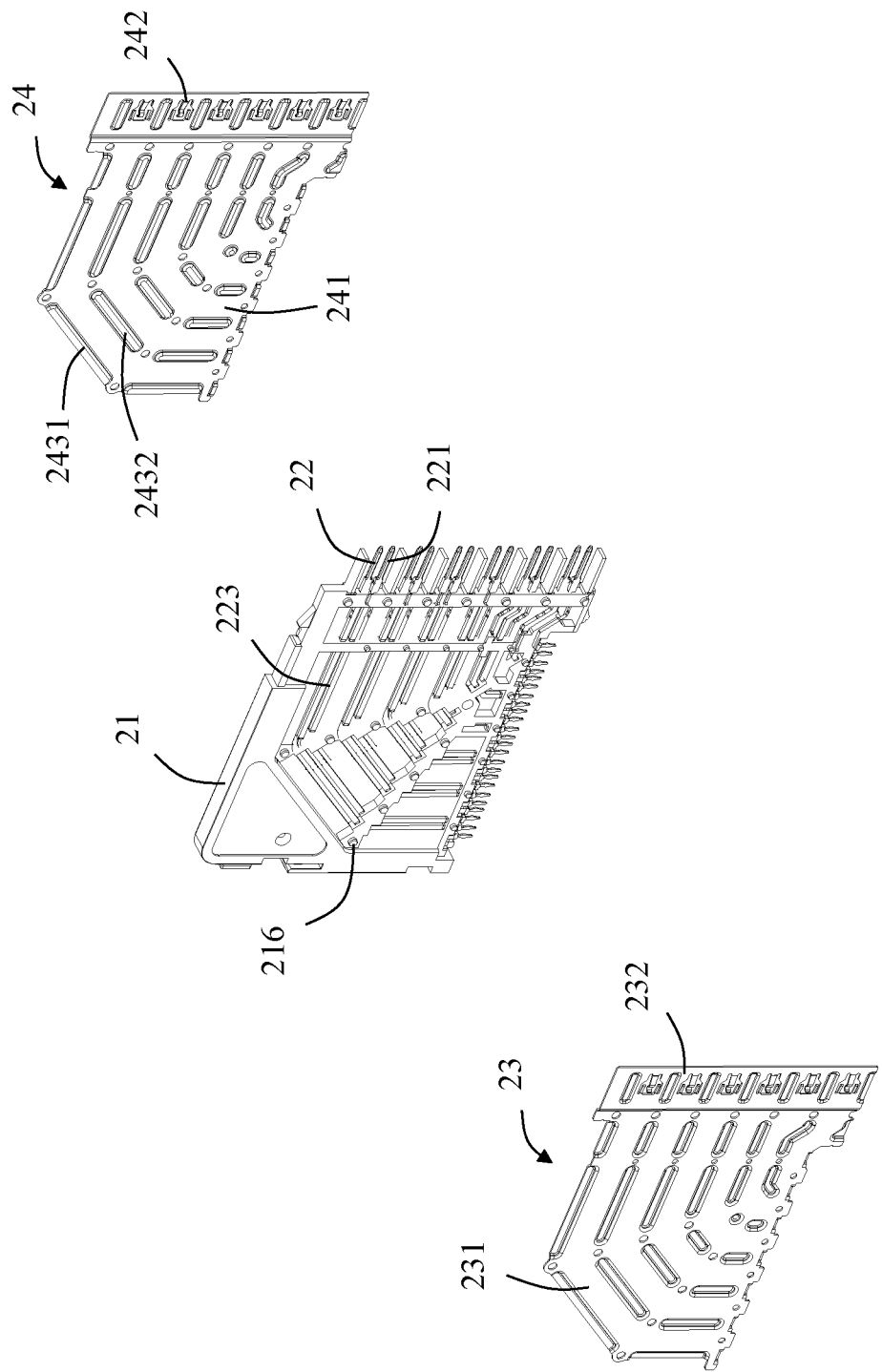
FIG. 8 is a partially exploded perspective view of FIG. 7 from another angle.
Figure 9:
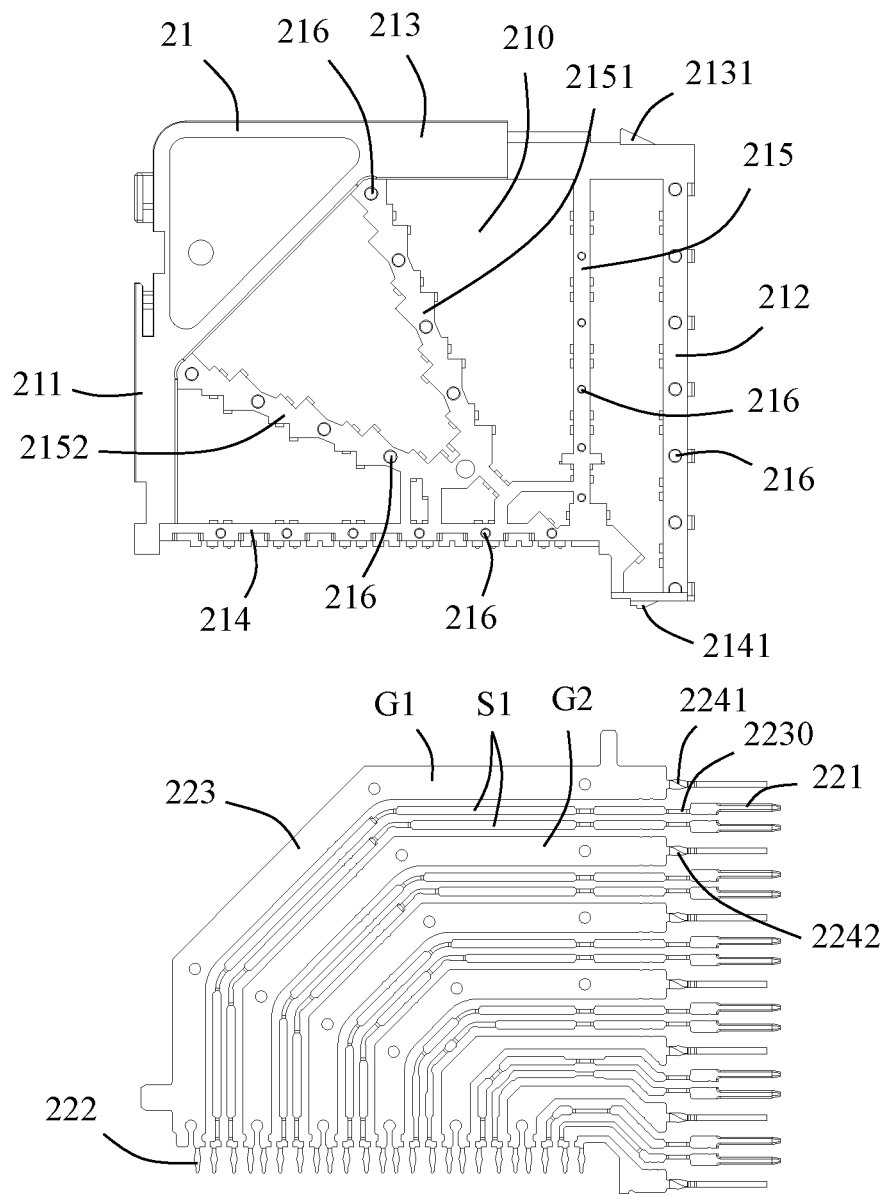
FIG. 9 is a side view of an insulating frame when separated from conductive terminals.

Referring to FIGS. 7 to 9, the wafer 2 includes an insulating frame 21, a plurality of conductive terminals 22 fixed to the insulating frame 21, a first metal shield 23 fixed on one side of the insulating frame 21, and a second metal shield 24 fixed on the other side of the insulating frame 21.

Referring to FIG. 9, each insulating frame 21 is roughly frame-shaped and includes a rear wall 211, a front wall 212 opposite to the rear wall 211, a top wall 213 connecting one end of the rear wall 211 and one end of the front wall 212, a bottom wall 214 connecting the other end of the rear wall 211 and the other end of the front wall 212, and a plurality of connecting walls 215. The connecting walls 215 are capable of enhancing the structural strength of the frame. In the illustrated embodiment of the present disclosure, the insulating frame 21 includes a hollow portion 210. The connecting walls 215 include a first connecting wall 2151 connecting the top wall 213 and the bottom wall 214, and a second connecting wall 2152 connecting the rear wall 211 and the bottom wall 214. The first connecting wall 2151 and the second connecting wall 2152 are exposed in the hollow portion 210. The top wall 213 includes a first locking protrusion 2131 for being inserted into the first locking groove 122. The bottom wall 214 includes a second locking protrusion 2141 for being inserted into the second locking groove 132. The insulating frame 21 further includes a plurality of posts 216 for fixing the first metal shield 23 and the second metal shield 24. Referring to FIG. 9, each conductive terminal 22 includes a contact portion 221, a tail portion 222 and a connection portion 223 connecting the contact portion 221 and the tail portion 222. Some of the contact portions 221 are used to electrically connect with the second backplane connector 200. The tail portions 222 are used for being mounted to the first circuit board 301. In the illustrated embodiment of the present disclosure, the contact portion 221 is substantially perpendicular to the tail portion 222. The connection portion 223 is of a curved configuration.

Each group of conductive terminals 22 include a plurality of first ground terminals G1, a plurality of second ground terminals G2, and a plurality of signal terminals S1. In the illustrated embodiment of the present disclosure, two adjacent signal terminals S1 form a pair of differential signal terminals. Each pair of differential signal terminals are located between one first ground terminal G1 and one second ground terminal G2. That is, each group of conductive terminals 22 are arranged in a manner of G1-S1-S1-G2, which is beneficial to improve the quality of signal transmission. The differential signal terminals are narrow-side coupling or wide-side coupling. A width of the first ground terminal G1 and a width the second ground terminal G2 are greater than a width of each signal terminal S1 which is located between the first ground terminal G1 and the second ground terminal G2. Therefore, it is beneficial to increase the shielding area and improve the shielding effect.

In the illustrated embodiment of the present disclosure, the connection portions 223 of the conductive terminals 22 are partially insert-molded with the insulating frame 21. Each connection portion 223 of the signal terminal S1 has a narrowed portion 2230 insert-molded with the insulating frame 21 so as to adjust the impedance of the signal terminal S1 for achieving impedance matching. In the illustrated embodiment of the present disclosure, the contact portion 221 of the signal terminal S1 is substantially needle-shaped. The contact portion 221 of the first ground terminal G1 and the contact portion 221 of the second ground terminal G2 are substantially rectangular-shaped. The contact portion 221 of the signal terminal S1 and the connection portion 223 of the conductive terminal 22 are both coplanar, which means they are located in a same first plane (for example, a horizontal plane). It should be noted that the technical term "coplanar" used in the present disclosure is intended to indicate that related components are substantially flush, which includes situations of incomplete coplanarity caused by manufacturing tolerances. In the illustrated embodiment of the present disclosure, the first ground terminal G1 includes a first torsion portion 2241 connecting its contact portion 221 and its tail portion 222, so that the contact portion 221 of the first ground terminal G1 is located in a second plane (for example, a vertical plane) perpendicular to the first plane. The second ground terminal G2 includes a second torsion portion 2242 connecting its contact portion 221 and its tail portion 222, so that the contact portion 221 of the second ground terminal G2 is also located in the second plane (for example, the vertical plane) perpendicular to the first plane. The contact portion 221 of the first ground terminal G1 and the contact portion 221 of the second ground terminal G2 are parallel to each other. In the illustrated embodiment of the present invention, the connection portions 223 of the differential signal terminals, the connection portion 223 of the first ground terminal G1, and the connection portion 223 of the second ground terminal G2 are exposed in the same hollow portion 210.

Figure 10:
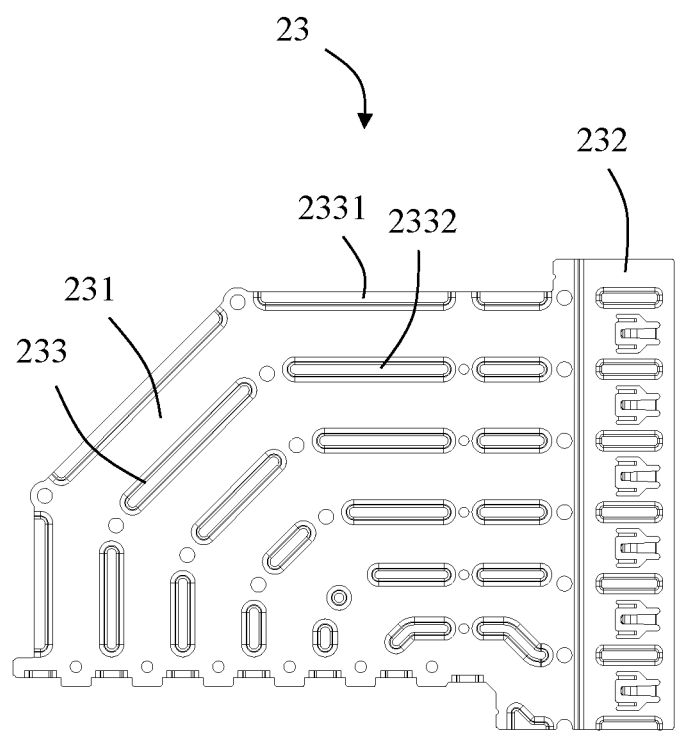
FIG. 10 is a side view of a first metal shield of the first backplane connector.
Figure 15:
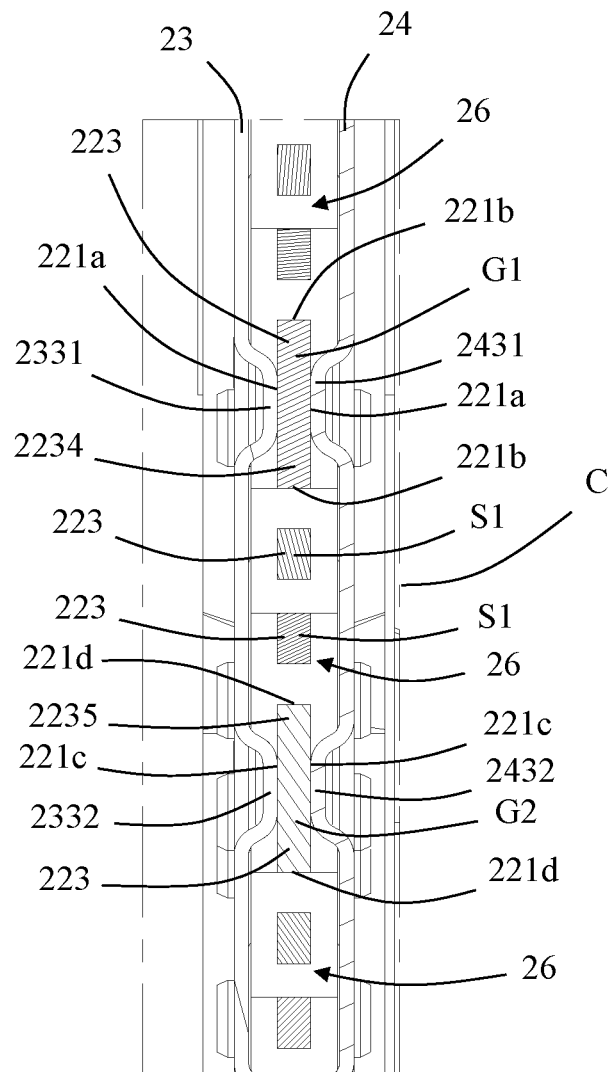
FIG. 15 is a partial enlarged view of a frame part C in FIG. 14.
Figure 16:
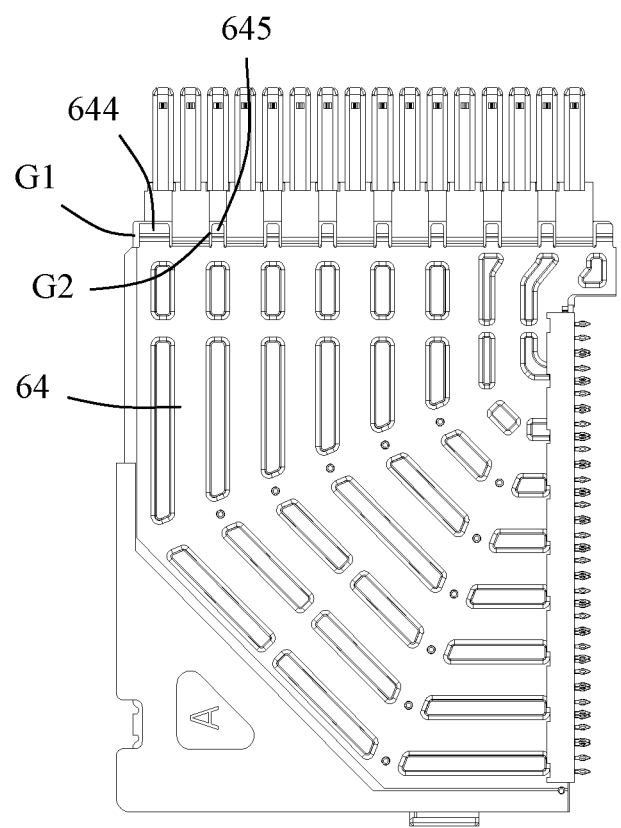
FIG. 16 is a top view of a wafer of a second backplane connector.

In the illustrated embodiment of the present disclosure, the first metal shield 23 and the second metal shield 24 are symmetrically disposed on opposite sides of the insulating frame 21. Referring to FIGS. 7, 8 and 10, the first metal shield 23 includes a first main body portion 231 and a first extension portion 232 extending from the first main body portion 231. The first main body portion 231 is located on one side of the connection portions 223 of the conductive terminals 22. The first extension portion 232 is located on one side of the contact portions 221 of the conductive terminals 22. The first main body 231 includes a plurality of ribs 233. The ribs 233 include a plurality of first ribs 2331 protruding toward the first ground terminals G1 and a plurality of second ribs 2332 protruding toward the second ground terminals G2. The first ribs 2331 corresponding to the first ground terminal G1 are disposed along an extending direction of the connection portion 223 of the first ground terminal G1. The second ribs 2332 corresponding to the second ground terminal G2 are disposed along an extending direction of the connection portion 223 of the second ground terminal G2. In the illustrated embodiment of the present disclosure, the first ribs 2331 and the second ribs 2332 are formed by stamping the first main body portion 231. The first ribs 2331 and the second ribs 2332 protrude toward the second metal shield 24. The first ribs 2331 and the second ribs 2332 are discontinuously disposed along the extending direction of the connection portion 223 of the first ground terminal G1 and the extending direction of the connection portion 223 of the second ground terminal G2, respectively, so as to achieve multi-position contact. In order to improve the reliability of the contact between the first metal shield 23 and the first ground terminals G1 and the second ground terminals G2. In the illustrated embodiment of the present disclosure, referring to FIG. 15, a wall thickness of the first rib 2331, a wall thickness of the second rib 2332, and a wall thickness of a portion of the first main body 231 located between the first rib 2331 and the second rib 2332 are the same.

Figure 11:
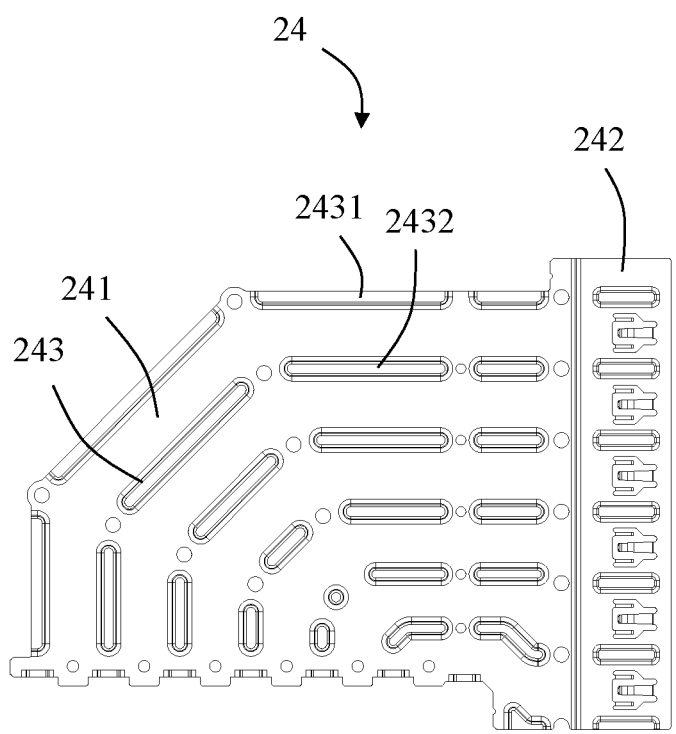
FIG. 11 is a side view of a second metal shield of the first backplane connector.
Figure 12:
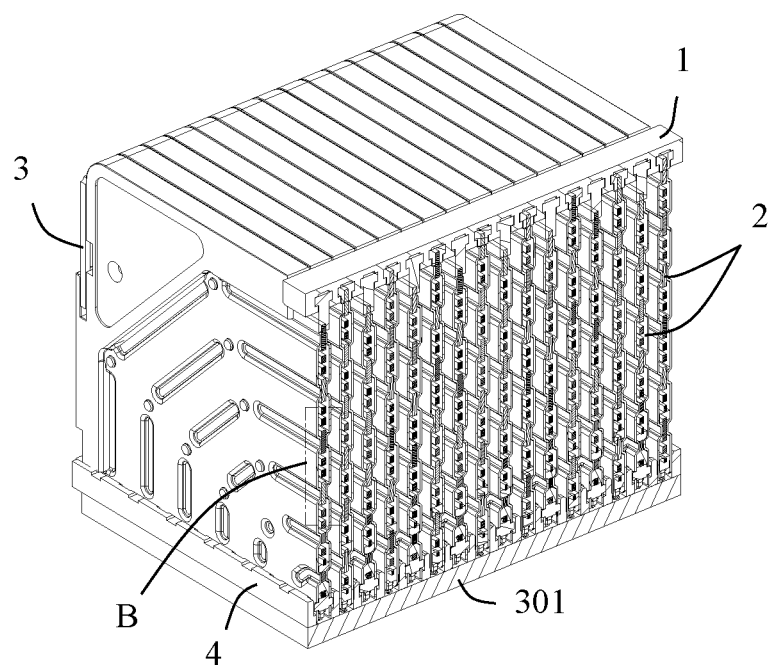
FIG. 12 is a partial perspective cross-sectional view taken along line A'-A' in FIG. 5.
Figure 13:
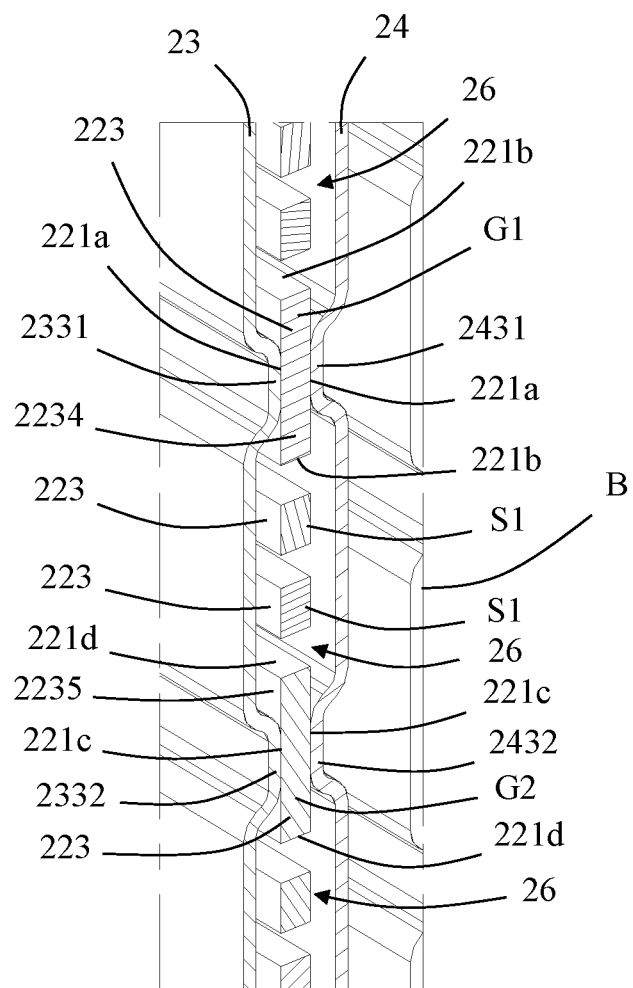
FIG. 13 is a partial enlarged view of a frame part B in FIG. 12.
Figure 14:
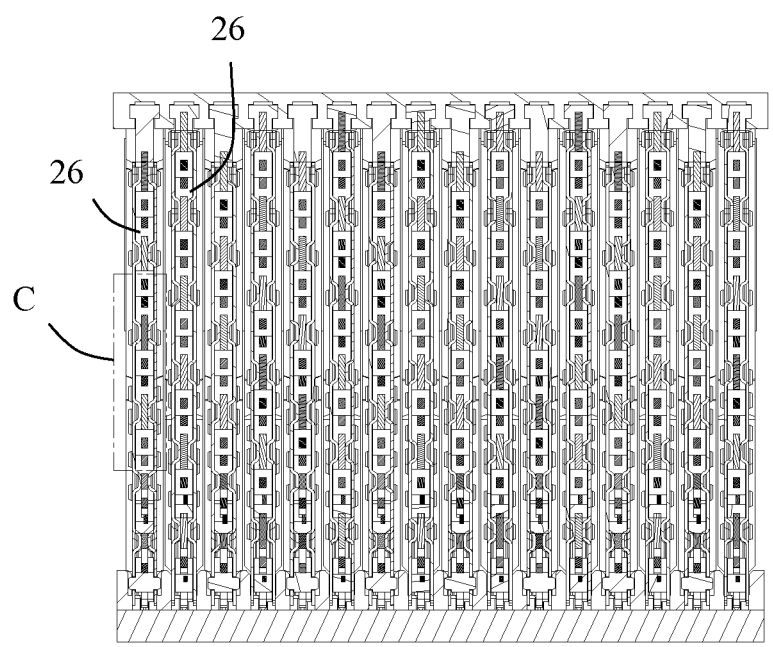
FIG. 14 is a front view of FIG. 12.

Similarly, referring to FIGS. 7, 8 and 11, the second metal shield 24 includes a second main body portion 241 and a second extension portion 242 extending from the second main body portion 241. The second main body portion 241 is located on the other side of the connection portions 223 of the conductive terminals 22. The second extension portion 242 is located on the other side of the contact portions 221 of the conductive terminals 22. In the illustrated embodiment of the present disclosure, the second extension portion 242 and the second main body portion 241 are located in different planes, in which the second extension portion 242 is farther away from the first metal shield 23 than the second main body portion 241. The second main body 241 includes a plurality of ribs 243. The ribs 243 include a plurality of third ribs 2431 protruding toward the first ground terminals G1 and a plurality of fourth ribs 2432 protruding toward the second ground terminals G2. The third ribs 2431 are disposed along the extending direction of the connection portion 223 of the first ground terminal G1. The fourth ribs 2432 are disposed along the extending direction of the connection portion 223 of the second ground terminal G2. In the illustrated embodiment of the present disclosure, the third ribs 2431 and the fourth ribs 2432 are formed by stamping the second main body portion 241. The third ribs 2431 and the fourth ribs 2432 protrude toward the first metal shield 23. The third ribs 2431 and the fourth ribs 2432 are discontinuously disposed along the extending direction of the connection portion 223 of the first ground terminal G1 and the extending direction of the connection portion 223 of the second ground terminal G2, respectively, so as to achieve multi-position contact. As a result, the reliability of the contact between the second metal shield 24 and the first ground terminals G1 and the second ground terminals G2 is improved. In the illustrated embodiment of the present disclosure, a wall thickness of the third rib 2431, a wall thickness of the fourth rib 2432 and a wall thickness of a portion of the second main body 241 located between the third rib 2431 and the fourth rib 2432 are the same. In an embodiment of the present disclosure, soldering is performed on the surfaces of the ribs 233 and the ribs 243 to solder the ribs 233 and the ribs 243 to the first ground terminals G1 and the second ground terminals G2. For example, soldering is performed on the surfaces of the first ribs 2331, the second ribs 2332, the third ribs 2431 and the fourth ribs 2432 in order to solder the first ribs 2331, the second ribs 2332, the third ribs 2431 and the fourth rib 2432 to the first ground terminals G1 and the second ground terminals G2. The soldering method is at least one of spot soldering, laser soldering and ultrasonic soldering.

Referring to FIGS. 12 to 15, in the illustrated embodiment of the present disclosure, the connection portion 223 of the first ground terminal G1 has a first wide surface 221a and a first narrow surface 221b perpendicular to the first wide surface 221a. The connection portion 223 of the second ground terminal G2 has a second wide surface 221c and a second narrow surface 221d perpendicular to the second wide surface 221c. The connection portions 223 of each pair of differential signal terminals are located between the first narrow surface 221b of the first ground terminal G1 and the second narrow surface 221d of the second ground terminal G2 which are located on opposite sides of the connection portions 223 of each pair of differential signal terminals.

Along a length of the connection portion 223 of the conductive terminal 22, the first rib 2331 of the first metal shield 23 and the third rib 2431 of the second metal shield 24 respectively contact two opposite sides of the connection portion 223 of the first ground terminal G1, and the second rib 2332 of the first metal shield 23 and the fourth rib 2432 of the second metal shield 24 respectively contact two opposite sides of the connection portion 223 of the second ground terminal G2, thereby forming a shielding cavity 26 surrounding the outer periphery of the connection portions 223 of each pair of differential signal terminals. In the illustrated embodiment of the present disclosure, the first rib 2331 and the third rib 2431 respectively contact the first wide surface 221a of the connection portion 223 of the first ground terminal G1. The second rib 2332 and the fourth rib 2432 respectively contact the second wide surface 221c of the connection portion 223 of the second ground terminal G2. In the illustrated embodiment of the present disclosure, the shielding cavity 26 is jointly formed by the first main body portion 231, the second main body portion 241, the first ground terminal G1 and the second ground terminal G2. The connection portion 223 of the first ground terminal G1 includes a first tab portion 2234 protruding into the shielding cavity 26. The connection portion 223 of the second ground terminal G2 includes a second tab portion 2235 protruding into the shielding cavity 26. The connection portions 223 of the differential signal terminals are located between the first tab portion 2234 and the second tab portion 2235. In the illustrated embodiment of the present disclosure, there are a plurality of the shielding cavities 26 which are disposed along an arrangement direction of each group of the conductive terminals 22. Two adjacent shielding cavities 26 share a single first ground terminal G1 or a single second ground terminal G2. In addition, a part of the shared first ground terminal G1 protrudes into one shielding cavity 26, and another part of the shared first ground terminal G1 protrudes into another shielding cavity 26.

In the illustrated embodiment of the present disclosure, there are multiple wafers 2 of the first backplane connector 100, and the terminal arrangement of two adjacent wafers 2 are staggered. Correspondingly, the shielding cavities 26 at the same position of two adjacent wafers 2 are staggered (referring to FIG. 14).

Referring to FIGS. 3 and 4, the second backplane connector 200 includes a header 5, a plurality of wafers 6 assembled to the header 5, a spacer 7 holding on one side of the plurality of wafers 6, and a mounting block 8 holding the other side of the plurality of wafers 6.

The header 5 is made of insulating material. The header 5 includes a body portion 51, a wall portion 52 extending from the body portion 51 to one end, and a frame portion 53 extending from the body portion 51 to the other end. The body portion 51 includes a plurality of terminal receiving grooves 511 extending forwardly and rearwardly. In the illustrated embodiment of the present disclosure, the terminal receiving grooves 511 are disposed in multiple rows along a left-right direction. Two adjacent rows of terminal receiving grooves 511 are staggered in a vertical direction. That is, in two adjacent rows of the terminal receiving grooves 511, the terminal receiving grooves 511 at corresponding positions are not in alignment with each other in the left-right direction. The wall portion 52 includes a first wall portion 521 and a second wall portion 522 disposed opposite to each other. The first wall portion 521 includes a plurality of first slots 5211. The second wall portion 522 includes a plurality of second slots 5221. The first slot 5211 and the second slot 5221, which are in alignment with each other along the vertical direction, together with the second terminal receiving slot 511 corresponding to the first slot 5211 and the second slot 5221 are jointly used for receiving the same wafer 6.

The frame portion 53 includes a first extension wall 531, a second extension wall 532 opposite to the first extension wall 531, a top wall 533 connecting one end of the first extension wall 531 and one end of the second extension wall 532, a bottom wall 534 connecting the other end of the first extension wall 531 and the other end of the second extension wall 532, and a receiving space 535 jointly enclosed by the first extension wall 531, the second extension wall 532, the top wall 533 and the bottom wall 534. The receiving space 535 is used for at least partially accommodating the first backplane connector 100. Specifically, in the illustrated embodiment of the present disclosure, both the first extension wall 531 and the second extension wall 532 include a plurality of positioning grooves 530 disposed at intervals. The receiving space 535 is used for accommodating the header 1. The positioning grooves 530 are used for accommodating the corresponding positioning protrusions 14 so as to improve the mating accuracy of the first backplane connector 100 and the second backplane connector 200.

Referring to FIGS. 35 and 36, each wafer 6 includes an insulating frame 61, a plurality of conductive terminals 62 insert-molded with the insulating frame 61, a first metal shield 63 fixed on one side of the insulating frame 61, and a second metal shield 64 fixed on the other side of the insulating frame 61.

Each conductive terminals 62 includes a contact portion 621, tail portion 622, and a connection portion 623 connecting the contact portion 621 and the tail portion 622. Some of the contact portions 621 are used to electrically connect with the first backplane connector 100. The tail portion 622 are used to be mounted to the second circuit board 302. In the illustrated embodiment of the present disclosure, the contact portion 621 is substantially perpendicular to the tail portion 622. The connection portion 623 is of a curved configuration.

Each group of conductive terminals 62 include a plurality of first ground terminals G1, a plurality of second ground terminals G2, and a plurality of signal terminals S1. In the illustrated embodiment of the present disclosure, two adjacent signal terminals S1 form a pair of differential signal terminals. Each pair of differential signal terminals are located between one first ground terminal G1 and one second ground terminal G2. That is, each group of conductive terminals 62 are disposed in a manner of G1-S1-S1-G2, which is beneficial to improve the quality of signal transmission. The differential signal terminals are narrow-side coupling or wide-side coupling. A width of the first ground terminal G1 and a width of the second ground terminal G2 are greater than a width of each signal terminal S1 therebetween, which is beneficial to increase the shielding area and improve the shielding effect.

Figure 19:
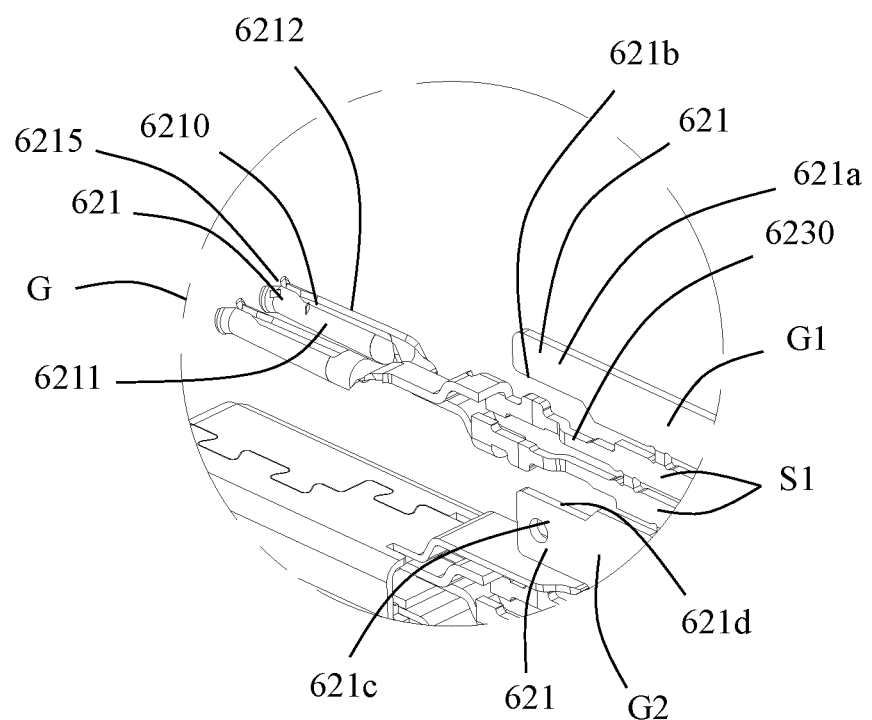
FIG. 19 is a partial enlarged view of a circled part G in FIG. 18.

In the illustrated embodiment of the present disclosure, the connection portions 623 of the conductive terminals 62 are partially insert-molded with the insulating frame 61. The connection portion 623 of the signal terminal S1 includes a narrowed portion 6230 insert-molded with the insulating frame 61 for adjusting the impedance of the signal terminal S1 in order to achieve impedance matching. Referring to FIG. 19, in the illustrated embodiment of the present disclosure, each contact portion 621 of the signal terminal S1 has a two-half structure, which includes a first contact section 6211, a second contact section 6212, and a slot 6210 located between the first contact section 6211 and the second contact section 6212. When the needle-shaped contact portion 221 of the signal terminal S1 of the first backplane connector 100 is inserted between the first contact section 6211 and the second contact section 6212, the first contact section 6211 and the second contact section 6212 can be elastically deformed in order to improve the contact reliability. The first contact section 6211 includes a first arc-shaped surface, and the second contact section 6212 includes a second arc-shaped surface. The first arc-shaped surface and the second arc-shaped surface are disposed opposite to each other so as to jointly form a mating hole 6215 for receiving the contact portion 221 of the signal terminal S1 of the first backplane connector 100. The two signal terminals S1 constituting a pair of differential signal terminals, their connection portions 623 are disposed in a first direction (for example, a vertical direction), and their contact portions 621 are disposed in a direction (for example, a left-right direction) perpendicular to the first direction.

Figure 17:
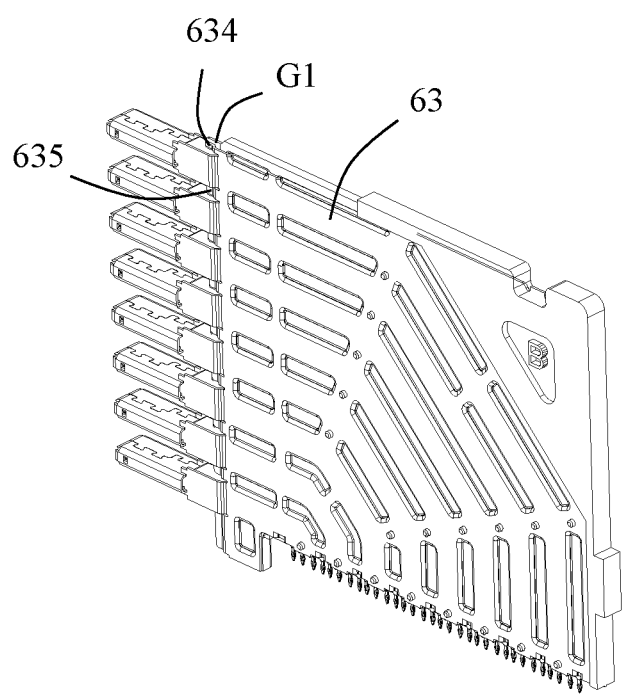
FIG. 17 is a perspective schematic view of the wafer of the second backplane connector.
Figure 18:
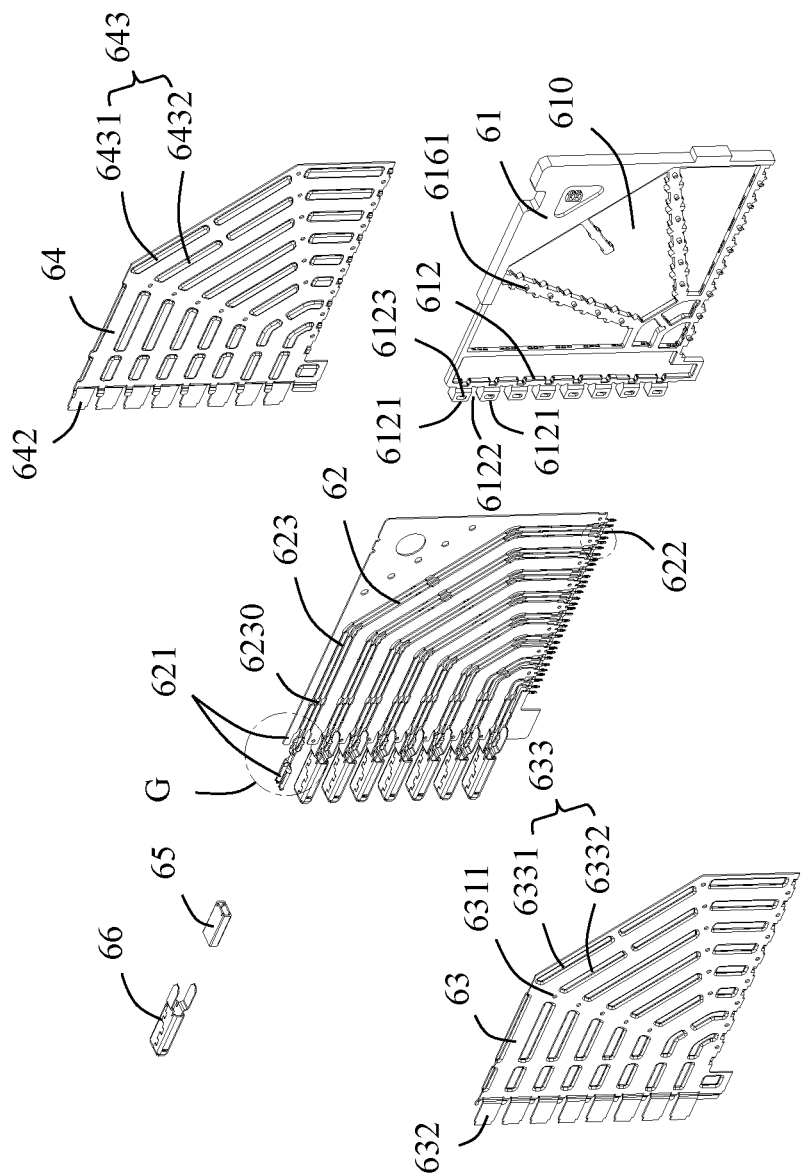
FIG. 18 is a partially exploded perspective view of FIG. 17.

Each contact portion 621 of the first ground terminal G1 and the second ground terminal G2 is substantially flat. The contact portion 621 of the first ground terminal G1, the contact portion 621 of the second ground terminal G2, and the connection portions 623 of the conductive terminals 62 are all coplanar. Referring to FIGS. 17 and 18, each group of wafers 6 further includes an insulating block 65 sleeved on the contact portions 621, and a metal shell 66 sleeved on the insulating block 65.

Figure 20:
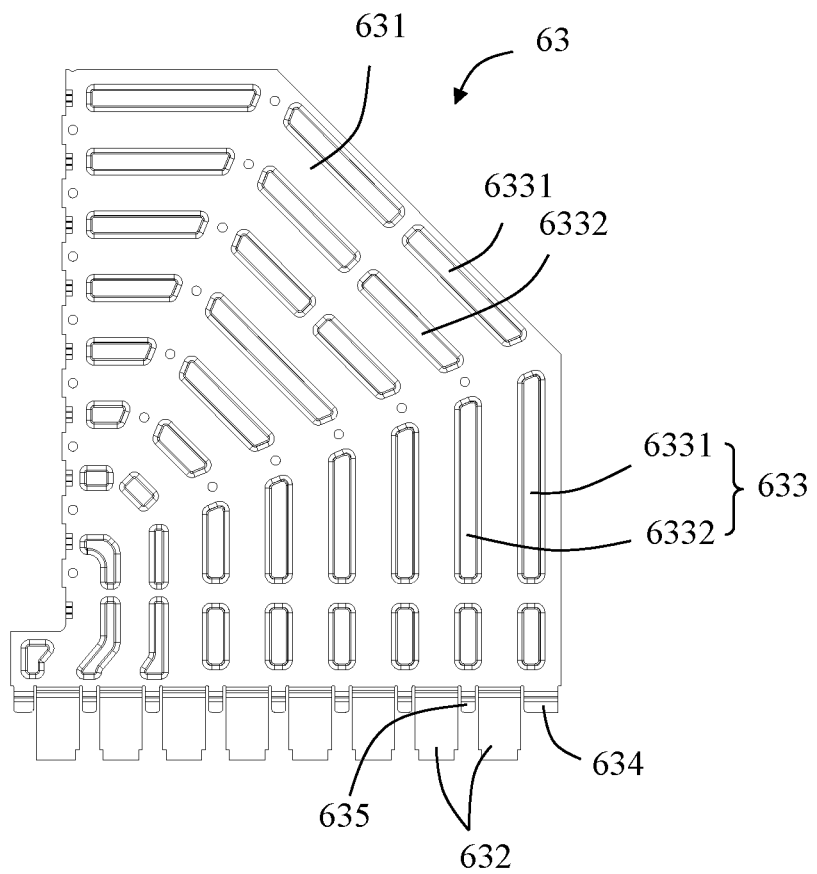
FIG. 20 is a side view of a first metal shield of the second backplane connector.

In the illustrated embodiment of the present disclosure, the first metal shield 63 and the second metal shield 64 are symmetrically disposed on both sides of the insulating frame 61. Referring to FIGS. 18 and 20, the first metal shield 63 includes a first main body portion 631, a first extension portion 632 extending from the first main body portion 631, and a first elastic arm 634 and a second elastic arm 635 which are respectively located on two sides of the first extension portion 632. The first elastic arm 634 and the second elastic arm 635 extend beyond the first main body portion 631 to contact the first ground terminal G1 and the second ground terminal G2, respectively. The first main body portion 631 is located on one side of the connection portion 623 of the conductive terminal 62. In the illustrated embodiment of the present disclosure, the first extension portion 632 and the first main body portion 631 are located in different planes, in which the first extension portion 632 is farther away from the second metal shield 64 than the first main body portion 631. The first main body portion 631 includes a plurality of ribs 633. The ribs 633 include a plurality of first ribs 6331 protruding toward the first ground terminal G1 and a plurality of second ribs 6332 protruding toward the second ground terminal G2. The first ribs 6331 are disposed along an extending direction of the connection portion 623 of the first ground terminal G1. The second ribs 6332 are disposed along an extending direction of the connection portion 623 of the second ground terminal G2. In the illustrated embodiment of the present disclosure, the first ribs 6331 and the second ribs 6332 are formed by stamping the first main body portion 631. The first ribs 6331 and the second ribs 6332 protrude toward the second metal shield 64. The first ribs 6331 and the second ribs 6332 are disposed discontinuously along the extending direction of the connection portion 623 of the first ground terminal G1 and the extending direction of the connection portion 623 of the second ground terminal G2, respectively, so as to achieve multi-position contact. Therefore, the reliability of the contact between the first metal shield 63 and the first ground terminals G1 and the second ground terminals G2 is improved. In the illustrated embodiment of the present disclosure, a wall thickness of the first rib 6331, a wall thickness of the second rib 6332, and a wall thickness of a portion of the first main body portion 631 located between the first rib 6331 and the second rib 6332 are the same.

Figure 21:
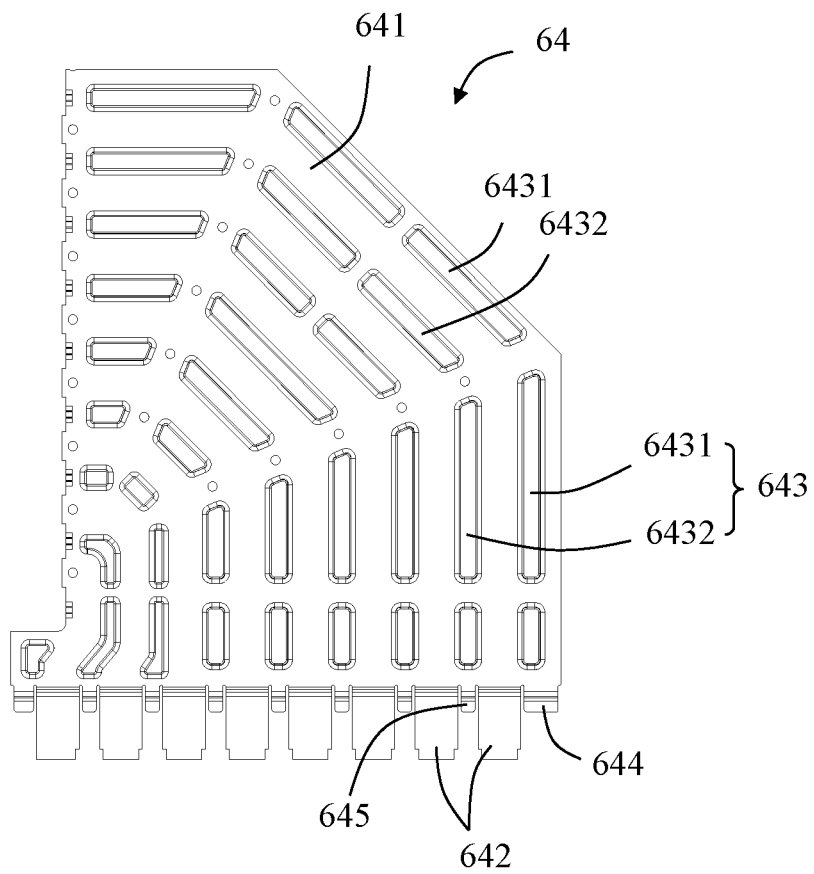
FIG. 21 is a side view of a second metal shield of the second backplane connector.

Similarly, referring to FIGS. 18 and 21, the second metal shield 64 includes a second main body portion 641, a second extension portion 642 extending from the second main body portion 641, and a third elastic arm 644 and a fourth elastic arm 645 which are respectively located on both sides of the second extension portion 642. The third elastic arm 644 and the fourth elastic arm 645 extend beyond the second main body portion 641 to contact the first ground terminal G1 and the second ground terminal G2, respectively. The second main body portion 641 is located on the other side of the connection portion 623 of the conductive terminal 62. In the illustrated embodiment of the present disclosure, the second extension portion 642 and the second main body portion 641 are located in different planes, in which the second extension portion 642 is farther away from the first metal shield 63 than the second main body portion 641. The second main body portion 641 includes a plurality of ribs 643. The ribs 643 include a plurality of third ribs 6431 protruding toward the first ground terminal G1 and a plurality of fourth ribs 6432 protruding toward the second ground terminal G2. The third ribs 6431 are disposed along the extending direction of the connection portion 623 of the first ground terminal G1. The fourth ribs 6432 are disposed along the extending direction of the connection portion 623 of the second ground terminal G2. In the illustrated embodiment of the present disclosure, the third ribs 6431 and the fourth ribs 6432 are formed by stamping the second main body portion 641. The third ribs 6431 and the fourth ribs 6432 protrude toward the first metal shield 63. The third ribs 6431 and the fourth ribs 6432 are disposed discontinuously along the extending direction of the connection portion 623 of the first ground terminal G1 and the extending direction of the connection portion 623 of the second ground terminal G2, respectively, so as to achieve multi-position contact. Therefore, the contact reliability between the second metal shield 64 and the first ground terminals G1 and the second ground terminals G2 is improved. In the illustrated embodiment of the present disclosure, a wall thickness of the third rib 6431, a wall thickness of the fourth rib 6432, and a wall thickness of a portion of the second main body portion 641 located between the third rib 6431 and the fourth rib 6432 are the same. In an embodiment of the present disclosure, soldering is performed on the surfaces of the ribs 633 and the ribs 643 to solder the ribs 633 and the ribs 643 to the first ground terminals G1 and the second ground terminals G2. For example, soldering is performed on the surfaces of the first ribs 6331, the second ribs 6332, the third ribs 6431 and the fourth ribs 6432 so that the first ribs 6331, the second ribs 6332, the third ribs 6431 and the fourth ribs 6432 are soldered to the first ground terminals G1 and the second ground terminals G2. The soldering method is at least one of spot soldering, laser soldering and ultrasonic soldering.

Figure 22:
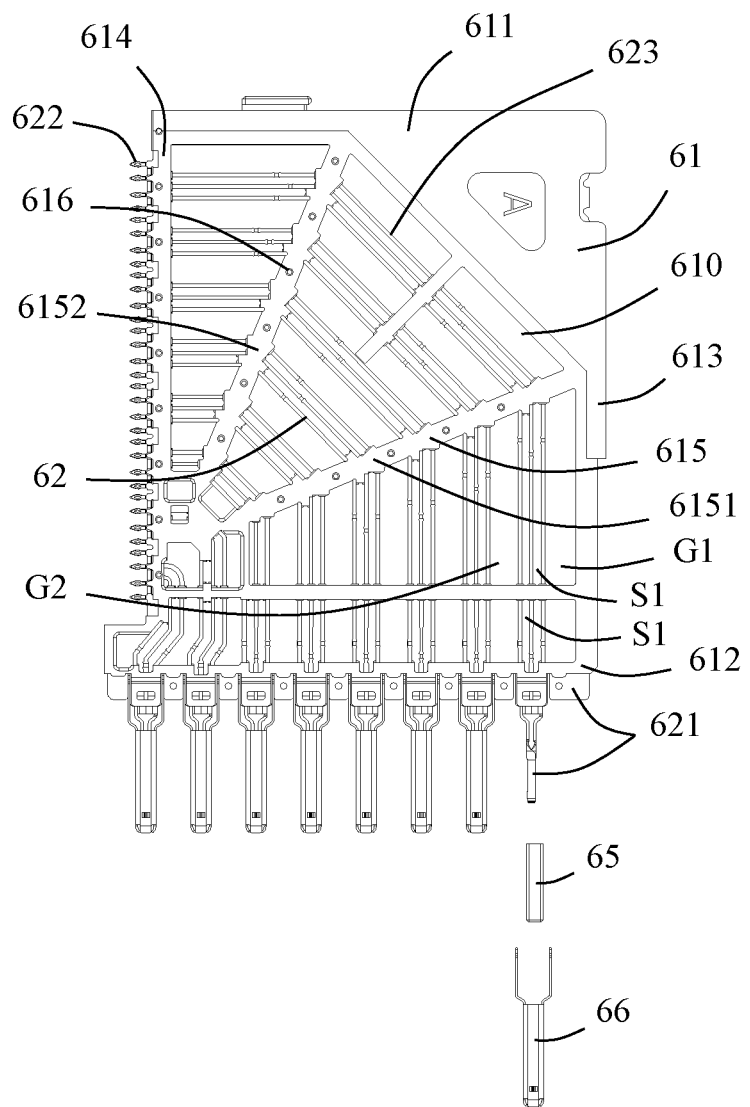
FIG. 22 is a side view after removing the first metal shield and the second metal shield in FIG. 18.

Referring to FIG. 22, the insulating frame 61 is roughly frame-shaped. The insulating frame 61 includes a rear wall 611, a front wall 612 opposite to the rear wall 611, a top wall 613 connecting one end of the rear wall 611 and one end of the front wall 612, a bottom wall 614 connecting the other end of the rear wall 611 and the other end of the front wall 612, and a plurality of connecting walls 615. The connecting walls 615 can enhance the structural strength of the frame. In the illustrated embodiment of the present disclosure, the insulating frame 61 includes a hollow portion 610. The connecting walls 615 include a first connecting wall 6151 connecting the top wall 613 and the bottom wall 614, and a second connecting wall 6152 connecting the rear wall 611 and the bottom wall 614. The first connecting wall 6151 and the second connecting wall 6152 are exposed in the hollow portion 610. In the illustrated embodiment of the present invention, the connection portions 623 of the differential signal terminals, the connection portion 623 of the first ground terminal G1, and the connection portion 623 of the second ground terminal G2 are exposed in the same hollow portion 610.

Figure 23:
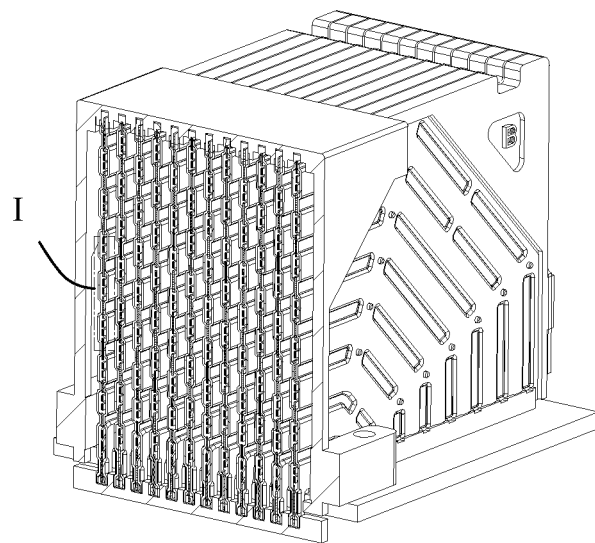
FIG. 23 is a partial perspective cross-sectional view taken along line B'-B' in FIG. 2.
Figure 24:
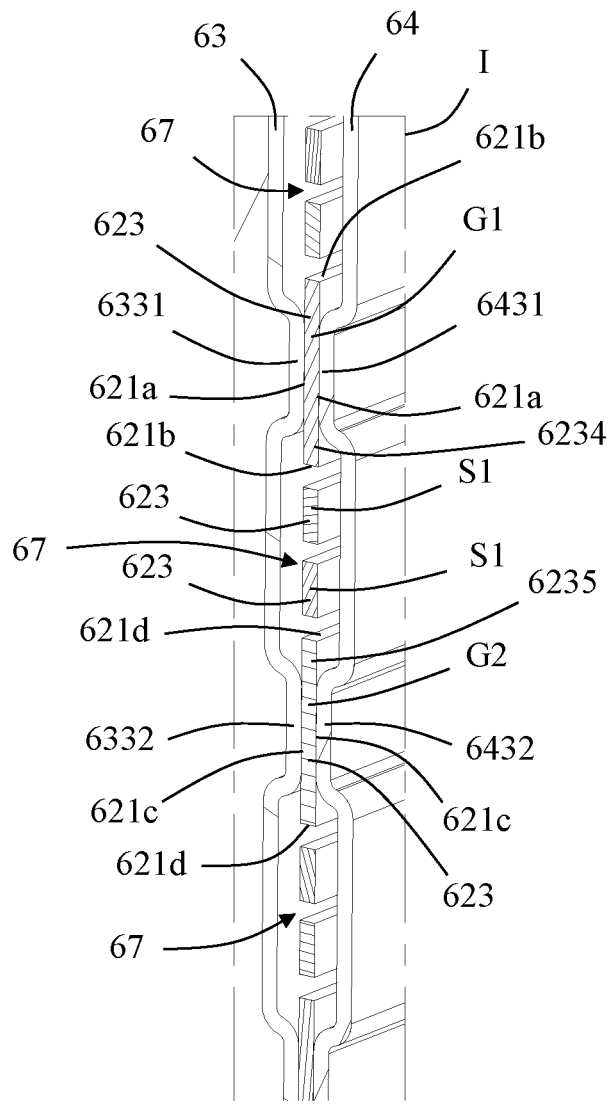
FIG. 24 is a partial enlarged view of a frame portion I in FIG. 23.

Referring to FIGS. 23 and 24, in the length of the connection portion 623 of the conductive terminal 62, the first rib 6331 of the first metal shield 63 and the third rib 6431 of the second metal shield 64 are in contact with two opposite side surfaces of the connection portion 623 of the first ground terminal G1, respectively. The second rib 6332 of the first metal shield 63 and the fourth rib 6432 of the second metal shield 64 are in contact with two opposite side surfaces of the connection portion 623 of the second ground terminal G2, respectively. As a result, a shielding cavity 67 surrounding the outer periphery of the connection portion 623 of each pair of differential signal terminals is formed. In the illustrated embodiment of the present disclosure, the first rib 6331 and the third rib 6431 contact the first wide surface 621a of the connection portion 623 of the first ground terminal G1, respectively. The second rib 6332 and the fourth rib 6432 contact the second wide surface 621c of the connection portion 623 of the second ground terminal G2, respectively. In the illustrated embodiment of the present disclosure, the shielding cavity 67 is formed by the first main body portion 631, the second main body portion 641, the first ground terminal G1 and the second ground terminal G2. The connection portion 623 of the first ground terminal G1 includes a first tab portion 6234 extending into the shielding cavity 67. The connection portion 623 of the second ground terminal G2 includes a second tab portion 6235 extending into the shielding cavity 67. The connection portions 623 of the differential signal terminals are located between the first tab portion 6234 and the second tab portion 6235. In the illustrated embodiment of the present disclosure, there are a plurality of shielding cavities 67 which are disposed along an arrangement direction of each group of the conductive terminals 62. Two adjacent shielding cavities 67 share a single first ground terminal G1 or a single second ground terminal G2. Taking the shared first ground terminal G1 as an example, a part of the shared first ground terminal G1 protrudes into one shielding cavity 67, and another part of the shared first ground terminal G1 protrudes into another shielding cavity 67.

In the illustrated embodiment of the present disclosure, there are multiple wafers 6 of the second backplane connector 200, and the terminal arrangement of two adjacent wafers 6 are staggered. Correspondingly, the shielding cavities 67 of two adjacent wafers 6 are also staggered. When the wafer 6 is assembled to the header 5, the metal shell 66 of the wafer 6 passes through the corresponding terminal receiving groove 511 so as to extend into the receiving space 535.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A backplane connector, comprising a wafer, the wafer comprising:
   a plurality of conductive terminals, each conductive terminals comprising a connection portion;
   an insulating frame fixed with the connection portions;
   a first metal shield comprising a first main body portion located on one side of the connection portions of the conductive terminals; and
   a second metal shield comprising a second main body portion located on the other side of the connection portions of the conductive terminals;
   wherein the conductive terminals comprise differential signal terminals, a first ground terminal and a second ground terminal, and the differential signal terminals are located between the first ground terminal and the second ground terminal;
   wherein the first main body portion comprises a first rib protruding toward the first ground terminal and a second rib protruding toward the second ground terminal;
   wherein the second main body portion comprises a third rib protruding toward the first ground terminal and a fourth rib protruding toward the second ground terminal;
   wherein the first rib and the third rib are respectively in contact with two opposite side surfaces of the connection portion of the first ground terminal, and the second rib and the fourth rib are respectively in contact with two opposite side surfaces of the connection portion of the second ground terminal; and
   wherein the first main body portion, the second main body portion, the first ground terminal and the second ground terminal jointly form a shielding cavity which encloses the connection portions of the differential signal terminals.

2. The backplane connector according to claim 1, wherein the connection portion of the first ground terminal comprises a first tab portion protruding into the shielding cavity, the connection portion of the second ground terminal comprises a second tab portion protruding into the shielding cavity, and the connection portions of the differential signal terminals are located between the first tab portion and the second tab portion.

3. The backplane connector according to claim 1, wherein the connection portions of the differential signal terminals, the connection portion of the first ground terminal and the connection portion of the second ground terminal are coplanar.

4. The backplane connector according to claim 3, wherein the connection portion of the first ground terminal comprises two first wide surfaces and two first narrow surfaces; the connection portion of the second ground terminal comprises two second wide surfaces and two second narrow surfaces; the first rib and the third rib are in contact with the two first wide surfaces of the first ground terminal, respectively; and the second rib and the fourth rib are in contact with the two second wide surfaces of the second ground terminal, respectively.

5. The backplane connector according to claim 1, wherein the first rib and the second rib are formed by stamping the first main body portion; and the third rib and the fourth rib are formed by stamping the second main body portion.

6. The backplane connector according to claim 5, wherein a wall thickness of the first rib, a wall thickness of the second rib, and a wall thickness of a portion of the first main body portion located between the first rib and the second rib are the same; and wherein a wall thickness of the third rib, a wall thickness of the fourth rib, and a wall thickness of a portion of the second main body portion located between the third rib and the fourth rib are the same.

7. The backplane connector according to claim 1, wherein the conductive terminals comprise multiple pairs of the differential signal terminals, and each pair of differential signal terminals is located between one first ground terminal and one second ground terminal; and wherein there are a plurality of shielding cavities, and two adjacent shielding cavities share one first ground terminal or one second ground terminal.

8. The backplane connector according to claim 1, wherein there are a plurality of wafers, and the shielding cavities at the same position of two adjacent wafers are staggered.

9. The backplane connector according to claim 1, wherein the conductive terminals are insert-molded with the insulating frame, and the insulating frame defines a hollow portion in which the connection portions are partially exposed;

wherein each conductive terminal comprises a contact portion connected to one end of the connection portion and a tail portion connected to the other end of the connection portion, and the contact portion and the tail portion extend beyond the insulating frame.

10. The backplane connector according to claim 1, wherein the differential signal terminals are narrow-side coupling or wide-side coupling.

11. The backplane connector according to claim 9, wherein the connection portions of the differential signal terminals and the connection portion of the first ground terminal or the connection portion of the second ground terminal are exposed in the same hollow portion.

12. The backplane connector according to claim 9, wherein the connection portions of the differential signal terminals, the connection portion of the first ground terminal, and the connection portion of the second ground terminal are exposed in the same hollow portion.

* * * * *